United States Patent
Lee et al.

(10) Patent No.: US 9,875,721 B2
(45) Date of Patent: Jan. 23, 2018

(54) NON-QUADRANGULAR DISPLAY AND DRIVING METHOD THEREOF

(71) Applicant: SAMSUNG DISPLAY CO., LTD., Yongin, Gyeonggi-Do (KR)

(72) Inventors: Seung-Kyu Lee, Asan-si (KR); Tae Hoon Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

(21) Appl. No.: 14/811,484

(22) Filed: Jul. 28, 2015

(65) Prior Publication Data
US 2016/0189664 A1 Jun. 30, 2016

(30) Foreign Application Priority Data
Dec. 31, 2014 (KR) .......................... 10-2014-0195932

(51) Int. Cl.
G09G 5/00 (2006.01)
H01L 27/12 (2006.01)
G09G 3/3266 (2016.01)

(52) U.S. Cl.
CPC ........... *G09G 5/003* (2013.01); *G09G 3/3266* (2013.01); *H01L 27/124* (2013.01); *G09G 2300/0408* (2013.01); *G09G 2300/0426* (2013.01); *G09G 2310/06* (2013.01); *G09G 2310/08* (2013.01); *G09G 2320/0223* (2013.01)

(58) Field of Classification Search
CPC ....... G06F 3/017; G06F 3/0421; G06F 3/0423
USPC .................................. 345/55, 690, 100, 611
See application file for complete search history.

(56) References Cited

U.S. PATENT DOCUMENTS

| | | | |
|---|---|---|---|
| 2008/0088568 A1* | 4/2008 | Haga ........................ | G09G 3/18 345/100 |
| 2009/0189835 A1 | 7/2009 | Kim et al. | |
| 2010/0013853 A1* | 1/2010 | Takatori ............ | G02F 1/134336 345/611 |
| 2010/0134743 A1* | 6/2010 | Shin .......................... | G02F 1/13 349/143 |
| 2010/0156945 A1* | 6/2010 | Yoshida ................ | G02F 1/1345 345/690 |

(Continued)

FOREIGN PATENT DOCUMENTS

JP 2009-69768 A 4/2009
KR 10-0599470 B1 7/2006
(Continued)

OTHER PUBLICATIONS

EPO Extended Search Report dated Jun. 24, 2016, for corresponding European Patent Application No. 15196315.4 (13 pages).

(Continued)

*Primary Examiner* — Tony Davis
(74) *Attorney, Agent, or Firm* — Lewis Roca Rothgerber Christie LLP

(57) ABSTRACT

A non-quadrangular display includes a plurality of gate lines and a plurality of signal supply lines connected to the gate lines through corresponding contact points from among a plurality of contact points, and a difference between linear loads based on the signal supply lines and the gate lines connected to two contact points that have a similar symmetrical relationship from among the plurality of contact points is less than a set threshold value.

15 Claims, 5 Drawing Sheets

(56) References Cited

U.S. PATENT DOCUMENTS

| | | | |
|---|---|---|---|
| 2014/0253419 A1* | 9/2014 | Tanada | G09G 3/2092 |
| | | | 345/55 |
| 2015/0255030 A1* | 9/2015 | Watsuda | G09G 3/3648 |
| | | | 345/92 |
| 2016/0005346 A1* | 1/2016 | Kim | G09G 3/3266 |
| | | | 345/690 |
| 2016/0019856 A1 | 1/2016 | Tanaka et al. | |
| 2016/0055779 A1* | 2/2016 | Lee | G09G 3/20 |
| | | | 345/55 |
| 2016/0189664 A1* | 6/2016 | Lee | G09G 5/003 |
| | | | 345/208 |
| 2016/0232837 A1* | 8/2016 | Lee | G09G 3/3688 |
| 2016/0232854 A1* | 8/2016 | Lee | G09G 3/3291 |
| 2016/0240141 A1* | 8/2016 | Lee | G02F 1/13454 |
| 2016/0329350 A1* | 11/2016 | Na | H01L 27/124 |
| 2016/0335982 A1* | 11/2016 | Park | G09G 5/006 |

FOREIGN PATENT DOCUMENTS

| | | |
|---|---|---|
| KR | 10-0721944 B1 | 5/2007 |
| KR | 10-2010-0017933 A | 2/2010 |
| KR | 10-1161865 B1 | 7/2012 |
| WO | WO 2014/142183 A1 | 9/2014 |

OTHER PUBLICATIONS

EPO Search Report dated Mar. 7, 2016, for corresponding European Patent application 15196315.4, (8 pages).

* cited by examiner

NON-QUADRANGULAR DISPLAY AND DRIVING METHOD THEREOF

CROSS-REFERENCE TO RELATED APPLICATION

This application claims priority to and the benefit of Korean Patent Application No. 10-2014-0195932, filed in the Korean Intellectual Property Office on Dec. 31, 2014, the entire content of which is incorporated herein by reference.

BACKGROUND

1. Field

The following description relates to a non-quadrangular display and a driving method thereof.

2. Description of the Related Art

To configure a display, a plurality of pixels, a plurality of gate lines, and a plurality of data lines are formed on a display panel. The respective pixels are connected to the corresponding gate lines and data lines. A plurality of scan signals are supplied through the plurality of gate lines, and a plurality of data signals are supplied through the plurality of data lines.

A non-quadrangular display, for example, a circular display including a circular display unit, has limits because of the shape of the display unit. A width of a bezel area at a circumference of the display unit of the circular display is restricted. As the bezel becomes wider in the display, a displaying area is reduced so that users' demands may not be satisfied.

Also, as the bezel area is made narrower, a region where a driver integrated circuit (IC) for generating a plurality of scan signals and a plurality of data signals can be located is limited. For example, the driver IC may be provided in a set or predetermined region at the entire circumference of the circular display panel. The driver IC includes a gate driving circuit and a data driving circuit.

In this instance, a line must be formed along the circumference of the circular display panel so as to receive a gate signal from a gate driving circuit, which causes a load of the corresponding line. The load may vary with respect to the position of the gate line so it is difficult to match a load between a plurality of gate lines.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward a non-quadrangular display for preventing deterioration of image quality by improving load matching of gate lines, and a driving method thereof.

An exemplary embodiment of the present invention provides a non-quadrangular display including: a plurality of gate lines formed in a first direction; a plurality of signal supply lines formed in a second direction crossing the first direction, and connected to the respective gate lines through corresponding contact points from among a plurality of contact points; and a display unit including a plurality of pixels connected to the gate lines, wherein a difference between linear loads based on the signal supply line and the gate line connected to two corresponding contact points from among the contact points is less than a set or predetermined threshold value.

The two corresponding contact points are provided at a same distance in the first direction with respect to a center of the display unit and are near in the second direction.

A layer on which the gate lines are formed is different from a layer on which the signal supply lines are formed.

The non-quadrangular display further includes a plurality of data lines formed in the second direction and connected to corresponding pixels from among the plurality of pixels.

The gate lines are arranged in the second direction, and the signal supply lines are arranged in the first direction.

The contact points include a plurality of first contact points provided on a first side with respect to the center of the display unit and a plurality of second contact points provided on a second side with respect to the center thereof.

The first contact points become distant from the center in the first direction and are formed in the second direction.

The second contact points become distant from the center in the first direction and are formed in the second direction.

Another embodiment of the present invention provides a non-quadrangular display including: a plurality of gate lines; a display unit including a plurality of pixels connected to the gate lines; a plurality of first signal supply lines connected to a plurality of corresponding gate lines from among the plurality of gate lines through a plurality of first contact points provided on the first side; a plurality of second signal supply lines connected to a plurality of corresponding gate lines from among the plurality of gate lines through a plurality of second contact points provided on the second side; and a gate driving circuit for alternately applying a gate signal with an enable level to the first signal supply lines and the second signal supply lines.

The first side and the second side are divided with respect to a center of the display unit.

A difference between a linear load based on a third signal supply line and a gate line connected to one of the first contact points and a linear load based on a fourth signal supply line and a gate line connected to one of the second contact points is less than a predetermined threshold value.

The gate driving circuit consecutively controls an enable time of a gate signal applied to the third signal supply line and an enable time of a gate signal applied to the fourth signal supply line.

A method for driving a non-quadrangular display according to an embodiment of the present invention is applicable to a non-quadrangular display including a plurality of signal supply lines and a plurality of gate lines connected to corresponding signal supply lines from among the plurality of signal supply lines through a corresponding contact point from among a plurality of contact points.

The method for driving a non-quadrangular display includes: applying a gate signal with an enable level to a first signal supply line connected to a first contact point provided on a first side from among the plurality of contact points; and applying a gate signal with an enable level to a second signal supply line connected to a second contact point provided on a second side from among the plurality of contact points.

A position of the first contact point corresponds to a position of the second contact point with respect to a center of the non-quadrangular display.

The first contact point and the second contact point are provided at a same distance in a first direction and are near in a second direction with respect to a center of the non-quadrangular display.

The method further includes: applying a gate signal with an enable level to a third signal supply line provided on the first side and connected to a third contact point provided near the first contact point in the second direction; and applying a gate signal with an enable level to a fourth signal supply line provided on the second side and connected to a fourth contact point provided near the second contact point in the second direction.

According to the embodiment of the present invention, the non-quadrangular display for preventing deterioration of image quality by improving the load matching of the gate lines, and a driving method thereof are provided.

DETAILED DESCRIPTION

Figure 1:
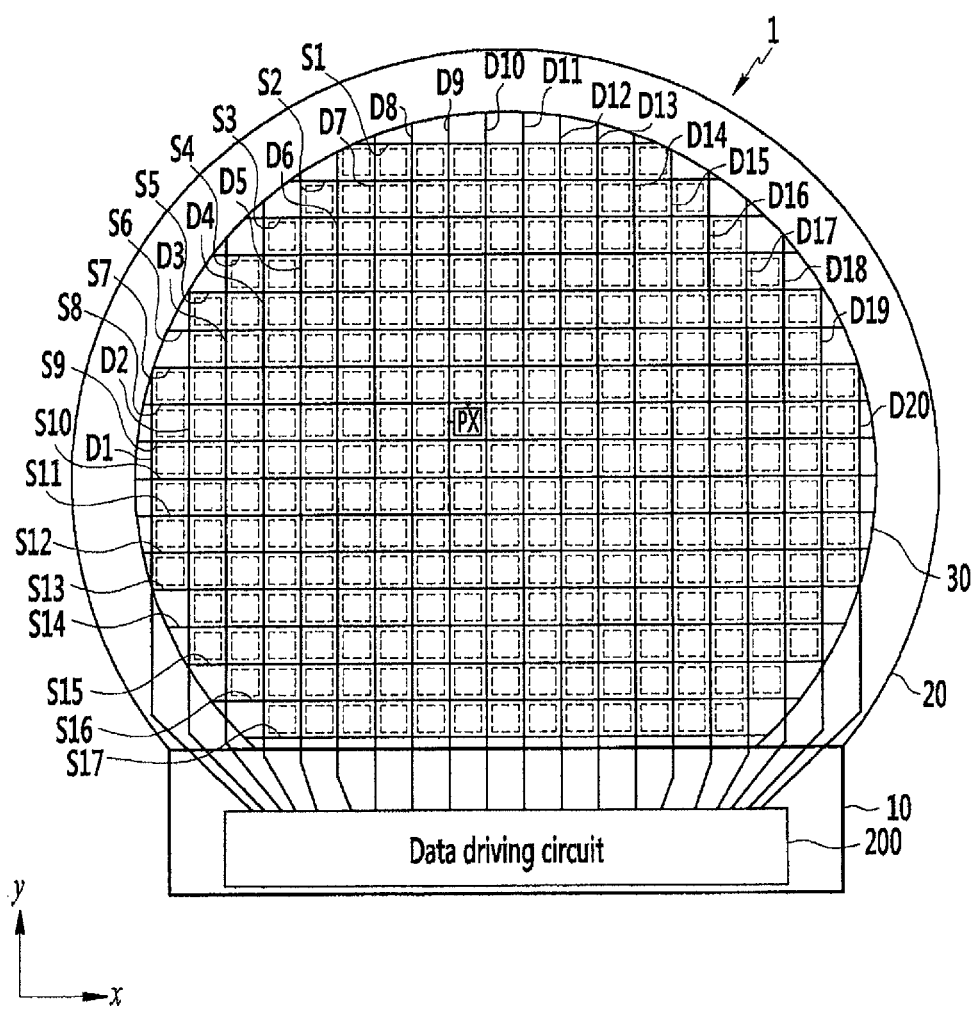
FIG. 1 shows a display according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. In addition, unless explicitly described to the contrary, the word "comprise" and variations such as "comprises" or "comprising" will be understood to imply the inclusion of stated elements but not the exclusion of any other elements. Further, the use of "may" when describing embodiments of the inventive concept refers to "one or more embodiments of the inventive concept." Also, the term "exemplary" is intended to refer to an example or illustration. As used herein, the terms "use," "using," and "used" may be considered synonymous with the terms "utilize," "utilizing," and "utilized," respectively.

FIG. 1 shows a display according to an exemplary embodiment of the present invention.

The display 1 of FIG. 1 is a non-quadrangular display, it is circular, and a border at which a driver IC 10 is connected to a display panel 20 is linear. However, the present invention is not restricted to this, and the shape is variable by its design. That is, the exemplary embodiment is applicable to the non-quadrangular display having length deviation among a plurality of gate lines and length deviation among a plurality of data lines because of a different shape from the related art quadrangular display.

The display 1 includes the display panel 20 and the driver IC 10. A display unit 30 in which a plurality of pixels are formed is provided on the display panel 20, and the driver IC 10 includes a data driving circuit 200 and first and second gate driving circuits 300 and 400 (refer to FIG. 3).

The display panel 20 includes a plurality of gate lines (S1-S17), data lines (D1-D20), signal supply lines (G1-G17, referring to FIG. 3), and pixels. The respective pixels are each connected to one of the gate lines (S1-S17) and one of the data lines (D1-D20).

Regions in which the pixels may be formed are shown with dotted line boxes in FIG. 1. A pixel PX connected to an eighth gate line S8 and a ninth data line D9 from among the plurality of pixels provided on the display unit 30 is shown with a solid line box. As shown in FIG. 1, the pixel PX is electrically connected to the corresponding gate line S8 and the data line D9, and it may receive a gate signal through the gate line S8 and a data signal through the data line D9.

Figure 2:
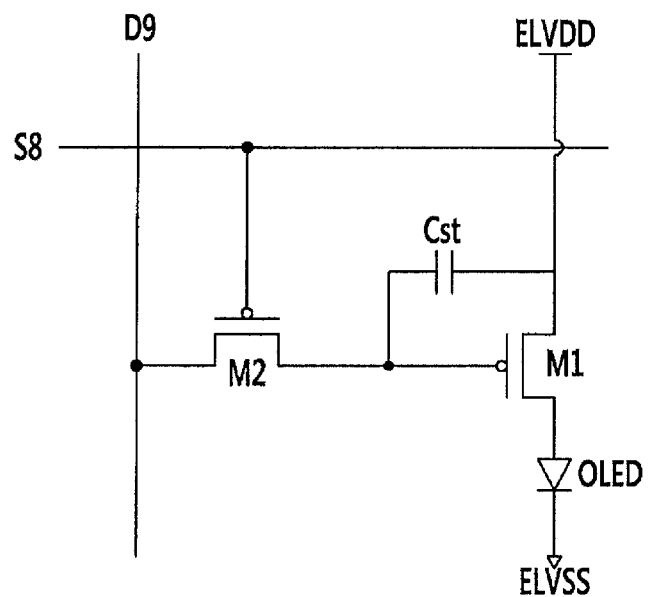
FIG. 2 shows a pixel according to an exemplary embodiment of the present invention.

FIG. 2 shows a pixel according to an exemplary embodiment of the present invention.

The pixel PX is shown to include an organic light emitting diode (OLED), but the present invention is not limited thereto. The pixel PX may include a liquid crystal element other than the organic light emitting diode (OLED). In addition, a pixel circuit (including a switching transistor M2, a driving transistor M1, and a capacitor (CST)) is shown in FIG. 2, and the pixel circuit for driving the organic light emitting diode (OLED) is not restricted to this.

As shown in FIG. 2, the switching transistor M2 includes a gate electrode connected to the gate line S8, a first electrode connected to the data line D9, and a second electrode connected to a gate electrode of the driving transistor M1. A voltage (ELVDD) is supplied to a first electrode of the driving transistor M1, and a capacitor (CST) is connected between a gate and a first electrode of the driving transistor M1. A second electrode of the driving transistor M1 is connected to an anode of the organic light emitting diode (OLED), and a cathode of the organic light emitting diode (OLED) is connected to a source of voltage (ELVSS).

The switching transistor M2 is turned on according to the gate signal supplied through the gate line S8, and while the switching transistor M2 is turned on, the data signal supplied through the data line D9 is programmed to the gate electrode of the driving transistor M1, and the programmed voltage is maintained by the capacitor (CST).

As shown in FIG. 1, a plurality of gate lines (S1-S17) are formed to extend along a first direction (e.g., to extend along an x-axis direction) and a plurality of data lines (D1-D20) are formed to extend along a second direction crossing the first direction (e.g., to extend along a y-axis direction) on the display unit 30.

The data driving circuit 200 generates a plurality of data signals, it is synchronized with an enable time of gate signals input to a plurality of gate lines (S1-S17), and it supplies a plurality of data signals to a plurality of data lines (D1-D20).

A plurality of signal supply lines connected to a plurality of gate lines (S1-S17), and a gate driving circuit will now be described with reference to FIG. 3.

Figure 3:
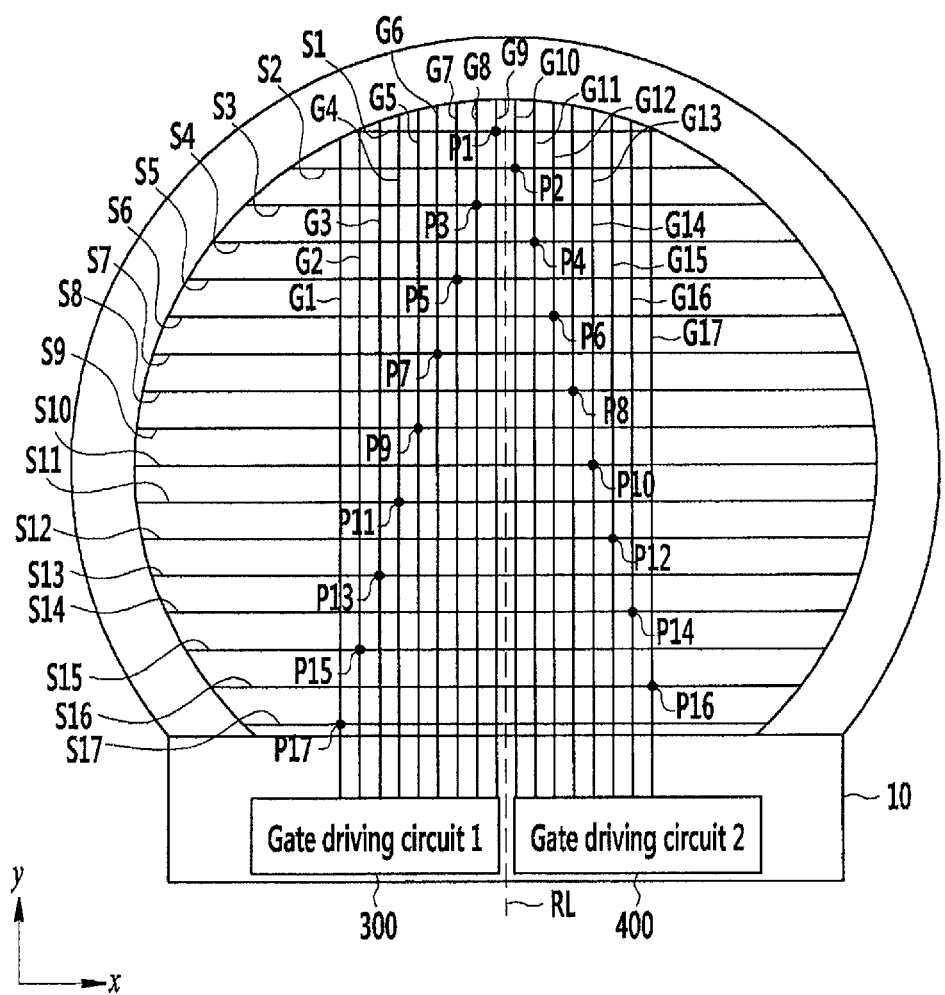
FIG. 3 shows a plurality of gate lines and a plurality of signal supply lines according to an exemplary embodiment of the present invention.

FIG. 3 shows a plurality of gate lines and a plurality of signal supply lines according to an exemplary embodiment of the present invention.

As shown in FIG. 3, the driver IC 10 further includes first and second gate driving circuits 300 and 400, and the display panel 20 further includes a plurality of signal supply lines (G1-G17) extending along the second direction crossing the first direction (e.g., to extend along the y-axis direction).

The driver IC 10 will be described to include two gate driving circuits 300 and 400 in the present exemplary embodiment. However, without being restricted to this, it may include a plurality of gate driving circuits, for example, four gate driving circuits. The number of gate driving circuits may be determined by a number of a plurality of signal supply lines formed on the display panel 20.

A layer on which a plurality of signal supply lines (G1-G17) are formed may be different from a layer on which a plurality of scan lines (S1-S17) are formed, and corresponding gate lines may be connected to the signal supply lines at (via) a plurality of contact points (P1-P17). A plurality of contact points (P1-P17) may be each configured with a contact hole and a contact electrode formed in the contact hole, but a realization of the contact points is not limited thereto.

A layer on which a plurality of data lines (D1-D20) shown in FIG. 1 are formed may be different from a layer on which a plurality of scan lines (S1-S17) are formed, and a layer on which a plurality of data lines (D1-D20) are formed may be the same as a layer on which a plurality of signal supply lines (G1-G17) are formed. The invention is not restricted to this, and a layer on which a plurality of data lines (D1-D20) are formed may be different from a layer on which a plurality of signal supply lines (G1-G17) are formed.

The first gate driving circuit 300 is connected to a plurality of signal supply lines (G1-G9), and it generates a plurality of gate signals to a plurality of signal supply lines (G1-G9) and outputs the same. The second gate driving circuit 400 is connected to a plurality of signal supply lines (G10-G17), and it generates a plurality of gate signals to a plurality of signal supply lines (G10-G17) and outputs the same.

A plurality of signal supply lines (G1-G9) are connected to a plurality of gate lines (S1, S3, . . . , S17) through a plurality of contact points (P1, P3, . . . , P17). A plurality of signal supply lines (G10-G17) are connected to a plurality of gate lines (S2, S4, . . . , S16) through a plurality of contact points (P2, P4, . . . , P16).

For example, the signal supply line G1 is connected to the gate line S17 through the contact point P17, the signal supply line G2 is connected to the gate line S15 through the contact point P15, the signal supply line G8 is connected to the gate line S3 through the contact point P3, and the signal supply line G9 is connected to the gate line S1 through the contact point P1. The signal supply line G10 is connected to the gate line S2 through the contact point P2, the signal supply line G11 is connected to the gate line S4 through the contact point P4, the signal supply line G16 is connected to the gate line S14 through the contact point P14, and the signal supply line G17 is connected to the gate line S16 through the contact point P16.

It is shown in FIG. 3 that odd-numbered gate lines are connected to a plurality of signal supply lines (G1-G9) and even-numbered gate lines are connected to a plurality of signal supply lines (G10-G17), but the present invention is not limited thereto.

In FIG. 3, one (e.g., P1) of a plurality of contact points (P1, P3, P5, . . . , P17) and one (e.g., P2) of a plurality of contact points (P2, P4, P6, . . . , P16) are provided to be close to symmetrical to each other with reference to a reference line (RL) in a center (hereinafter, similarly symmetrical). A plurality of contact points (P1, P3, P5, . . . , P17) are formed to be sequentially further distant from the reference line (RL) in the x-axis direction. A plurality of contact points (P2, P4, P6, . . . , P16) are formed to be sequentially further distant from the reference line (RL) in the x-axis direction.

For example, the contact point P1 and the contact point P2 have a same distance in the x-axis direction with reference to the reference line (RL), and are adjacent (proximate or near) in the y-axis direction. Therefore, a difference between a load (hereinafter, a linear load) of the signal supply line G9 and the gate line S1 and a linear load of the signal supply line G10 and the gate line S2 is substantially very small. In more detail, the difference between the linear load corresponding to the contact point P1 and the linear load corresponding to the contact point P2 may be set to be less than a set or predetermined threshold value. In a like manner, the contact point P3 and the contact point P4, the contact point P5 and the contact point P6, . . . , and the contact point P15 and the contact point P16 correspond to each other, and the difference between the linear loads connected to two corresponding contact points is very small. A positional relationship between two corresponding contact points will be referred to as a similar symmetrical relationship.

The number of gate lines and signal supply lines is shown as 17 in FIG. 1 and FIG. 3, a contact point that has a similar symmetrical relationship with the contact point P17 is not shown, and it should be apparent that a contact point having a similar symmetrical relationship with the contact point P17 may exist according to the number of gate lines and signal supply lines.

Therefore, the linear loads corresponding among contact points neighboring in the x-axis and y-axis directions are similar to each other to realize load matching. A dummy load for the load matching among the linear loads is reduced, which is easy to design. The dummy load signifies a load electrically connected to the line to match the loads between the lines.

A time for enabling a plurality of gate signals may be controlled based upon the configuration shown in FIG. 3. That is, an order for enabling the gate signal may be designed in consideration of the load matching.

For example, linear loads of the signal supply line G9 and the gate line S1 and linear loads of the signal supply line G10 and the gate line S2 are similar so the gate signal supplied to the gate line S1 and the gate signal supplied to the gate line S2 may be consecutively enabled. The gate signal supplied to the gate line S3 is enabled, and the gate signal supplied to the gate line S4 is enabled. According to the above-noted method, the gate signal supplied to the gate line S16 may be enabled and the gate signal supplied to the gate line S17 may be enabled. This may be realized in an opposite order.

The first and second gate driving circuits 300 and 400 operable based on the connection status shown in FIG. 3 will now be described with reference to FIG. 4 and FIG. 5.

Figure 4:
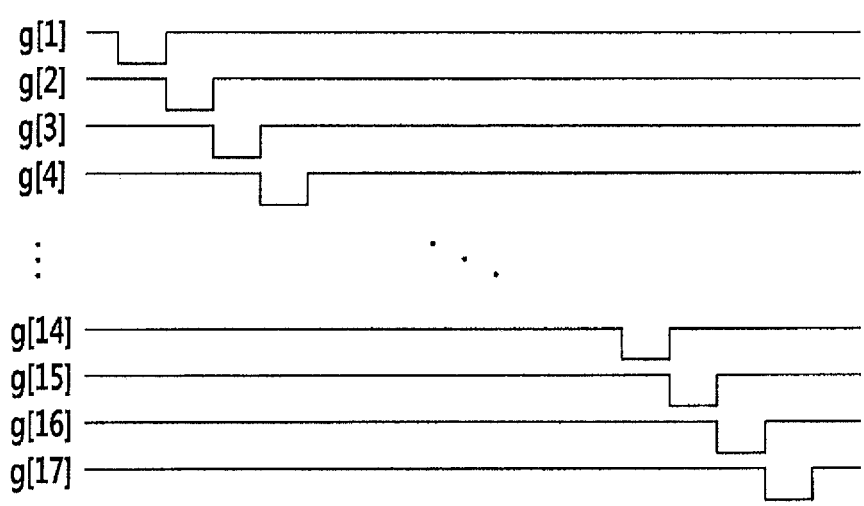
FIG. 4 shows a waveform diagram of a plurality of gate signals.

FIG. 4 shows a waveform diagram of a plurality of gate signals.

The gate signals (g[1]) to (g[17]) are sequentially applied to a plurality of gate lines (S1-S17).

The first gate driving circuit 300 sequentially generates odd-numbered gate signals (g[2k−1], k is a natural number of 1 to 9) and applies the same to a plurality of signal supply lines (G1-G9). For example, the first gate driving circuit 300 generates a gate signal (g[1]) and applies it to the signal supply line G9, generates a gate signal (g[3]) and applies it to the signal supply line G8, generates a gate signal (g[15]) and applies it to the signal supply line G2, and generates a gate signal (g[17]) and applies it to the signal supply line G1.

The second gate driving circuit 400 sequentially generates even-numbered gate signals (g[2k], k is a natural number of 1 to 8) and applies the same to a plurality of signal supply lines (G10-G17). For example, the second gate driving circuit 400 generates a gate signal (g[2]) and applies it to the signal supply line G10, generates a gate signal (g[4]) and applies it to the signal supply line G11, generates a gate signal (g[14]) and applies it to the signal supply line G16, and generates a gate signal (g[16]) and applies it to the signal supply line G17.

As described, the first gate driving circuit 300 and the second gate driving circuit 400 alternately enable the corresponding gate signals based on the connection relationship between the signal supply line and the gate line shown in FIG. 3.

The gate signals with an enable level are sequentially applied in order of S1→S2→S3→S4 ... →S17. In a temporal manner, the linear loads corresponding to the contact points to which the gate signals with an enable level are applied are similar. The term "similar" in this instance may signify that a load difference among linear loads corresponding to the contact points to which the gate signals are supplied consecutively with respect to time may be less than a set or predetermined threshold value. Hence, a steep change of the linear load with respect to time may be prevented to thus prevent deterioration of image quality.

An order for enabling the gate signals may be different from the waveform of FIG. 4.

Figure 5:
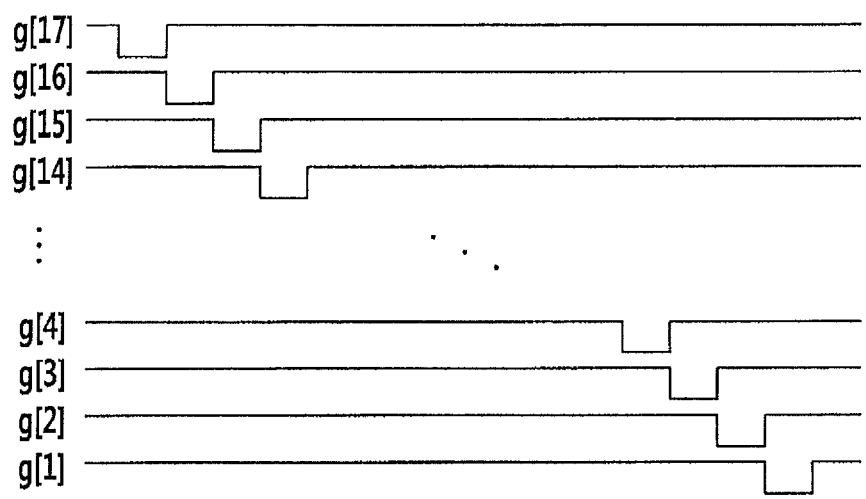
FIG. 5 shows a waveform diagram for indicating an exemplary variation of an enable order of a gate signal.

FIG. 5 shows a waveform diagram for indicating an exemplary variation of an enable order of a gate signal.

As shown in FIG. 5, the waveform diagram is in reverse order of that shown in FIG. 4.

The gate signals (g[17]) to (g[1]) are sequentially applied to a plurality of gate lines (S1-S17).

The first gate driving circuit 300 sequentially generates odd-numbered gate signals (g[2k−1], k is a natural number of 1 to 9) in a reverse order of FIG. 4 and applies the same to a plurality of signal supply lines (G1-G9). For example, the first gate driving circuit 300 generates a gate signal (g[17]) and applies it to the signal supply line G1, generates a gate signal (g[15]) and applies it to the signal supply line G2, generates a gate signal (g[3]) and applies it to the signal supply line G8, and generates a gate signal (g[1]) and applies it to the signal supply line G9.

The second gate driving circuit 400 sequentially generates even-numbered gate signals (g[2k], k is a natural number of 1 to 8) in a reverse order of FIG. 4 and applies the same to a plurality of signal supply lines (G10-G17). For example, the second gate driving circuit 400 generates a gate signal (g[16]) and applies it to the signal supply line G17, generates a gate signal (g[14]) and applies it to the signal supply line G16, generates a gate signal (g[4]) and applies it to the signal supply line G11, and generates a gate signal (g[2]) and applies it to the signal supply line G10.

As described, the first gate driving circuit 300 and the second gate driving circuit 400 alternately enable the corresponding gate signals based on the connection relationship between the signal supply line and the gate line shown in FIG. 3.

The gate signals with an enable level are sequentially applied in order of S17→S16→S15→S14 ... →S1. Compared to FIG. 4, the same effect is provided while the order is reversed. In a temporal manner, the linear loads corresponding to the contact points to which the gate signals with an enable level are applied are similar. Hence, a steep change of the linear load with respect to time may be prevented to thus prevent deterioration of image quality.

The configuration for providing a linear load matching in a non-quadrangular display and a driving method thereof have been described with reference to the exemplary embodiment. The number of signal supply lines, gate lines, and data lines have been described to describe the exemplary embodiment, but are not limited thereto.

Further, the odd-numbered lines and the even-numbered lines are grouped and divided from among a plurality of gate lines, but are not limited thereto. When four gate driving circuits are provided, a plurality of gate lines may be grouped to correspond to respective gate driving circuits.

For example, the driver IC may include a gate driving circuit for supplying gate signals to the contact point P1, the contact point P5, ..., the contact point P17, a gate driving circuit for supplying gate signals to the contact point P2, the contact point P6, ..., the contact point P14, a gate driving circuit for supplying gate signals to the contact point P3, the contact point P7, ..., the contact point P15, and a gate driving circuit for supplying gate signals to the contact point P4, the contact point P8, ..., the contact point P16. In this case, a plurality of gate lines may be grouped to correspond to respective gate driving circuits. The order for enabling the gate signals may follow the exemplary embodiment described with reference to FIG. 4 and FIG. 5.

As described above, it is easy to design a dummy load; a size of the dummy load may be reduced, so it is easy to design an electrostatic discharge (ESD) circuit on the external side of the display panel.

The display and/or any other relevant devices or components according to embodiments of the present invention described herein may be implemented utilizing any suitable hardware, firmware (e.g. an application-specific integrated circuit), software, or a combination of software, firmware, and hardware. For example, the various components of the display may be formed on one integrated circuit (IC) chip or on separate IC chips. Further, the various components of the display may be implemented on a flexible printed circuit film, a tape carrier package (TCP), a printed circuit board (PCB), or formed on one substrate. Further, the various components of the display may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. A non-quadrangular display comprising:
a plurality of gate lines extending along a first direction;

a plurality of signal supply lines extending along a second direction crossing the first direction, and connected to respective ones of the gate lines through corresponding contact points from among a plurality of contact points; and a display unit comprising a plurality of pixels connected to the gate lines, wherein a difference between linear loads based on the signal supply lines and the gate lines connected to two corresponding contact points from among the contact points is less than a set threshold value, and wherein the signal supply lines are configured to transmit gate signals to the gate lines via the plurality of contact points.

2. The non-quadrangular display of claim 1, wherein the two corresponding contact points are provided at a same distance in the first direction with respect to a center of the display unit and are adjacent in the second direction.

3. The non-quadrangular display of claim 1, wherein a layer on which the gate lines are formed is different from a layer on which the signal supply lines are formed.

4. The non-quadrangular display of claim 1, further comprising
a plurality of data lines extending along the second direction and connected to corresponding pixels from among the plurality of pixels.

5. The non-quadrangular display of claim 1, wherein the gate lines are arranged with each other in the second direction, and
the signal supply lines are arranged with each other in the first direction.

6. The non-quadrangular display of claim 5, wherein the contact points include a plurality of first contact points provided on a first side with respect to a center of the display unit and a plurality of second contact points provided on a second side with respect to the center thereof.

7. The non-quadrangular display of claim 6, wherein the first contact points become further distant from the center in the first direction and are arranged with each other in the second direction.

8. The non-quadrangular display of claim 6, wherein the second contact points become further distant from the center in the first direction and are arranged with each other in the second direction.

9. The non-quadrangular display of claim 6, wherein the first contact points comprise one of the two corresponding contact points, and the second contact points comprise another one of the two corresponding contact points.

10. A non-quadrangular display comprising:
a plurality of gate lines;
a display unit including a plurality of pixels connected to the gate lines;
a plurality of first signal supply lines connected to a plurality of corresponding gate lines from among the plurality of gate lines through a plurality of first contact points provided on a first side;
a plurality of second signal supply lines connected to corresponding gate lines from among the plurality of gate lines through a plurality of second contact points provided on a second side; and
a gate driving circuit configured to alternately apply a gate signal with an enable level to the first signal supply lines and the second signal supply lines,
wherein the first side and the second side are divided with respect to a center of the display unit.

11. The non-quadrangular display of claim 10, wherein a difference between a linear load based on one of the first signal supply fines connected to one of the gate lines via one of the first contact points and a linear load based on one of the second signal supply lines connected to one of the gate lines via one of the second contact points is less than a set threshold value.

12. The non-quadrangular display of claim 11, wherein the gate driving circuit is configured to consecutively control an enable time of a gate signal applied to the one of the first signal supply lines and an enable time of a gate signal applied to the one of the second signal supply lines.

13. A method for driving a non-quadrangular display including a plurality of signal supply lines and a plurality of gate-lines connected to corresponding signal supply lines from among the plurality of signal supply lines through corresponding contact points from among a plurality of contact points, the method comprising:
applying a gate signal with an enable level to a first signal supply line of the signal supply lines, the first signal supply line being connected to a first contact point provided on a first side from among the plurality of contact points; and
applying a gate signal with an enable level to a second signal supply line of the signal supply lines, the second signal supply line being connected to a second contact point provided on a second side from among the plurality of contact points,
wherein a position of the first contact point corresponds to a position of the second contact point with respect to a center of the non-quadrangular display.

14. The method of claim 13, wherein
the first contact point and the second contact point are provided at a same distance in a first direction and are adjacent in a second direction with respect to the center of the non-quadrangular display.

15. The method of claim 14, further comprising:
applying a gate signal with an enable level to a third signal supply line of the signal supply lines, the third signal supply line being provided on the first side and connected to a third contact point of the contact points, the third contact point being provided next to the first contact point in the second direction on the first side; and
applying a gate signal with an enable level to a fourth signal supply line of the signal supply lines, the fourth signal supply line being provided on the second side and connected to a fourth contact point of the contact points, the fourth contact points being provided next to the second contact point in the second direction on the second side.

* * * * *